(12) United States Patent
Urbaniak et al.

(10) Patent No.: US 7,472,460 B2  
(45) Date of Patent: Jan. 6, 2009

(54) CLAMPING APPARATUS

(75) Inventors: Andreas Urbaniak, Muenster (DE); Uwe Hoffmann, Haan (DE); Mario Luebstorf, Wuelfrath (DE)

(73) Assignee: Delphi Technologies, Inc., Troy, MI (US)

( * ) Notice: Subject to any disclaimer, the term of this patent is extended or adjusted under 35 U.S.C. 154(b) by 422 days.

(21) Appl. No.: 11/202,533

(22) Filed: Aug. 12, 2005

(65) Prior Publication Data  
US 2006/0037181 A1    Feb. 23, 2006

(30) Foreign Application Priority Data  
Aug. 17, 2004   (EP) ................... 04019508

(51) Int. Cl.  
*F16B 11/00* (2006.01)  
*A44B 21/00* (2006.01)

(52) U.S. Cl. .................. 24/129 R; 24/545; 24/559

(58) Field of Classification Search ............... 24/115 A, 24/115 R, 129 R, 132 AA, 132 R, 499, 535, 24/543, 545, 547, 557, 559; 174/68.1, 68.3, 174/72 A, 72 R, 95–101, 117 F, 117 FF, 135; 248/49, 68.1, 71, 73, 74.1, 74.2, 74.3  
See application file for complete search history.

(56) References Cited

U.S. PATENT DOCUMENTS

| | | | | |
|---|---|---|---|---|
| 4,802,646 A * | 2/1989 | Cattani | ...................... | 248/74.2 |
| 5,118,215 A * | 6/1992 | Freier | ........................ | 248/74.2 |
| 5,277,387 A * | 1/1994 | Lewis et al. | ................ | 248/74.2 |
| 6,935,599 B2 * | 8/2005 | van Walraven | ............ | 248/74.1 |
| 6,978,973 B1 * | 12/2005 | Gretz | ........................ | 248/74.1 |
| 7,140,070 B2 * | 11/2006 | Yuta et al. | .................. | 248/74.1 |
| 7,301,101 B2 * | 11/2007 | Suzuki | ...................... | 174/68.1 |

* cited by examiner

*Primary Examiner*—Robert J Sandy  
*Assistant Examiner*—Ruth C Rodriguez  
(74) *Attorney, Agent, or Firm*—David P. Wood

(57) ABSTRACT

The invention relates to a clamping apparatus comprising a base body and two clamping straps which are arranged opposite one another on one side of the base body, are made flexible at least sectionally, extend convexly to one another in a non-clamping state of the clamping apparatus and can be brought into engagement by being pressed together in order thereby to fasten an object located between the clamping straps and the base body to the clamping apparatus of a clamping fit.

15 Claims, 3 Drawing Sheets

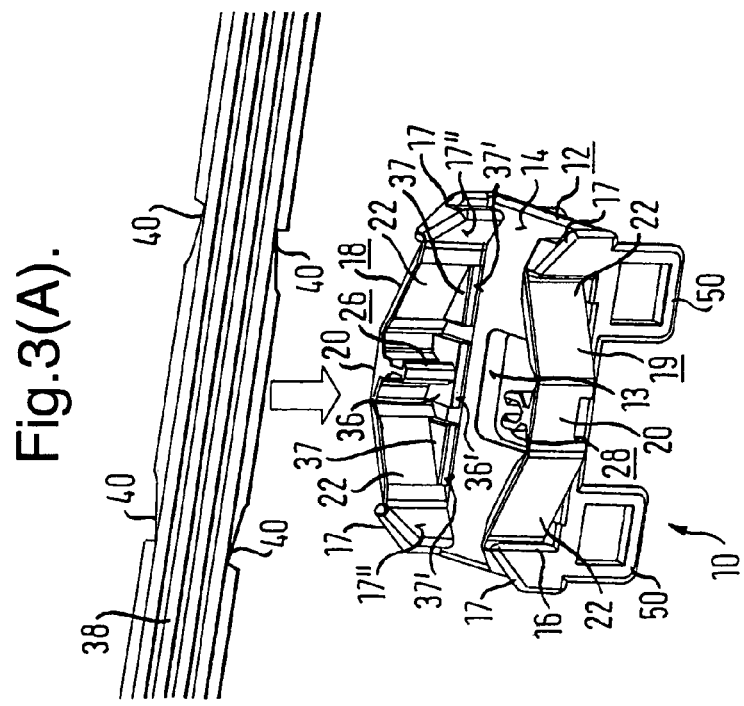
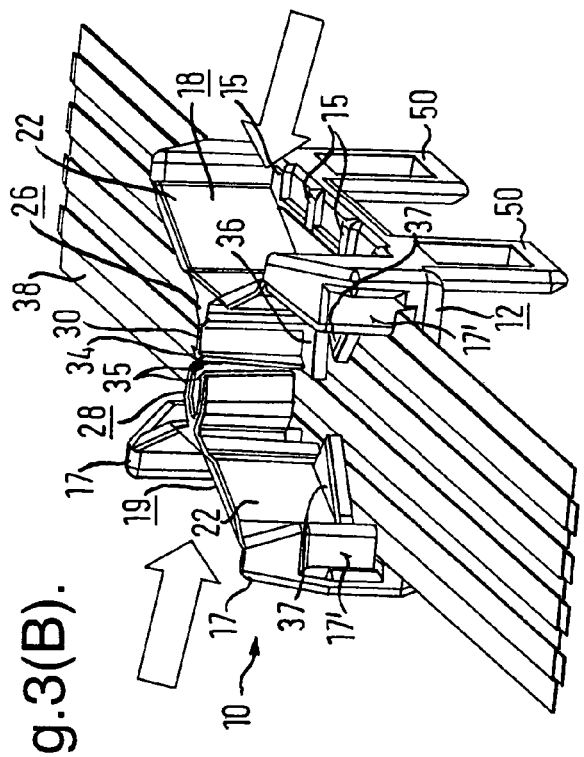
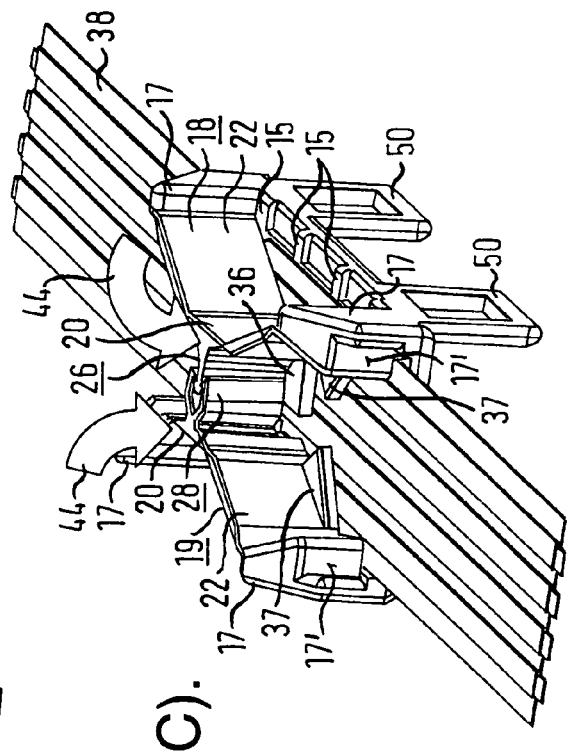

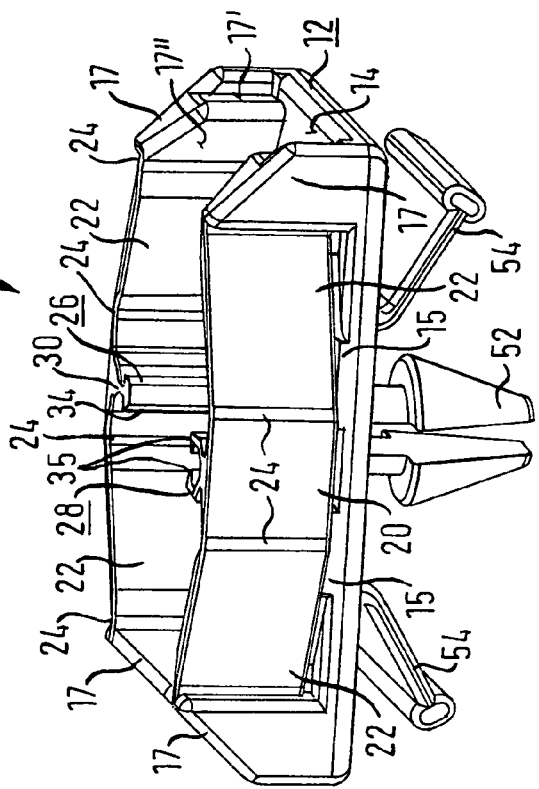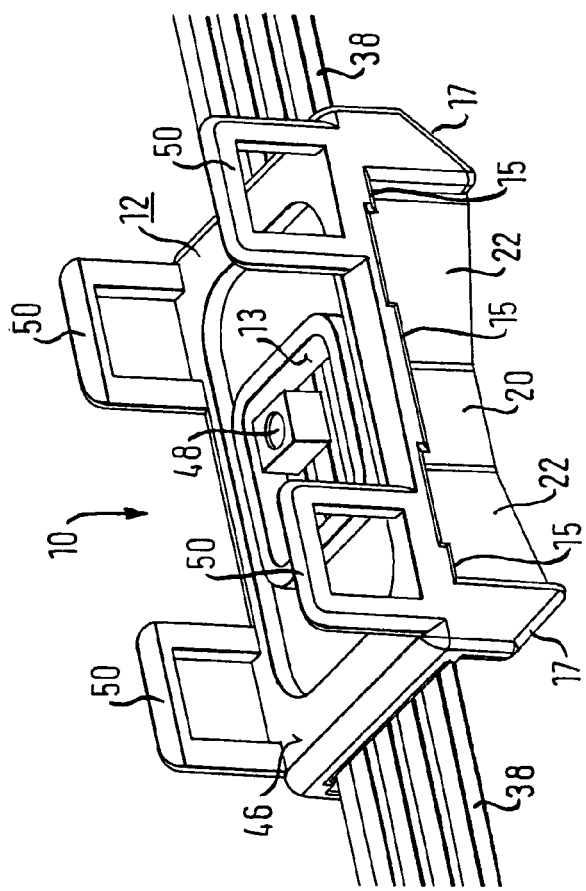

CLAMPING APPARATUS

TECHNICAL FIELD

The invention relates to a clamping apparatus comprising a base body and a clamping means by which the base body can be fastened to an object, for example to a flat conductor.

BACKGROUND OF THE INVENTION

Such a clamping apparatus is generally known. In one kind of clamping apparatus, a clamping arm is supported on a side of the base body by means of a complex hinge. The object to be fastened is placed on the base body, the clamping arm is folded over it and the free end of the clamping arm is latched to the base body to achieve a clamping connection of the object between the clamping arm and the base body. In another kind of clamping apparatus, it is a question of a two-part system that includes a base body and a separate clamping part which can be plugged together or placed onto one another and latched to one another, whereby an object arranged between the base body and the clamping part is held in a clamping manner.

It has proven to be a problem with both types of clamping apparatus that in each case two components which are separate at least originally, namely the base body and the clamping means, have to be joined together to form a complex article. Moreover, the assembly of the hinge described above and the folding over of the clamping means in an automated process is particularly problematic.

SUMMARY OF THE INVENTION

It is the underlying object of the invention to provide a simplified clamping apparatus which can be manufactured at a favorable cost, is easy to handle and can be integrated particularly easily into an automated assembly process.

A clamping apparatus having the features of claim 1 is provided to satisfy this object.

The clamping apparatus in accordance with the invention includes a base body and two clamping straps which are arranged opposite one another on one side of the base body, are made flexible at least sectionally, extend convexly to one another in a non-clamping state of the clamping apparatus and can be brought into engagement by being pressed together in order thereby to fasten an object located between the clamping straps and the base body to the clamping apparatus by means of a clamping fit.

Since the clamping straps extend convexly to one another in the non-clamping state of the clamping apparatus, i.e. have a larger spacing from one another in a middle region of the clamping straps than in the end regions of the clamping straps, an object to be clamped, for example a flat conductor, can easily be inserted into the clamping apparatus between the clamping straps.

A clamping of the object is achieved by a simple pressing together of the clamping straps. The clamping apparatus can, vice versa, be opened again by pulling the clamping straps apart.

When the clamping straps are pressed together, they spring out of their convex position into a concave position. In this position, the spacing between the clamping straps is smaller in the region of the clamping strap center than in the region of the clamping strap ends. Due to the concave extent of the clamping straps, they extend over the object inserted into the clamping apparatus and exert a clamping force on said object. The object is thereby secured in the clamping apparatus.

The pressing together of the clamping straps is a simple translatory movement which can easily be automated. The clamping apparatus in accordance with the invention is therefore particularly well suited for an automated assembly on objects to be clamped, in particular flat conductors such as flexible printed circuits (FPCs), flexible flat cables (FFCs) or extruded flexible circuits (EFCs).

The clamping apparatus in accordance with the invention can be fastened to all flat conductors available on the market thanks to a corresponding dimensioning of the base body and of the clamping straps, without the flat conductors having to be adapted, i.e. especially designed, for this purpose.

The clamping apparatus in accordance with the invention can furthermore be provided for different applications such as for the protection of electronic components, e.g. as light emitting diode holders or light emitting diode housings, as plug connectors, or as fastening means, e.g. clip holders, for the fastening of a flat conductor to a carrier or to a chassis.

Advantageous embodiments of the invention can be seen from the dependent claims, from the description and from the drawing.

In accordance with an advantageous embodiment of the clamping apparatus in accordance with the invention, the clamping straps can be fixed to one another in the pressed-together state. It is thereby prevented that the pressed-together clamping straps can spring open again on their own. A permanently reliable holding of the object in the clamping apparatus is thus ensured.

The clamping straps preferably have closing means, in particular latching means, which are made in a respectively complementary manner, for a fixing of the clamping straps in the pressed-together state. This permits a particularly simple latching of the clamping straps in the pressed-together state.

It is particularly advantageous for the closing means to be made such that, in the fixed state of the clamping straps, they effect a rotation of at least one clamping strap through which an intermediate space between the clamping strap and the base body is reduced and a clamping force is exerted in the direction of the base body. Since the closing means do not only serve for the latching of the clamping straps, but also effect a rotation of the clamping straps in the latched state which is responsible for the clamping force, the closing means satisfy a dual function. This simplifies the design of the clamping apparatus and permits an establishment of the clamping apparatus with a lower economic effort.

The closing means can extend transversely to the longitudinal extent of the clamping straps and substantially over the total width of the clamping straps. The reliability of the latch connection of the clamping straps is thereby increased in the pressed-together state.

The closing means of at least one clamping strap preferably has a lower height with respect to the clamping strap in a region remote from the base body than in a region facing the base body. A rotation of at least one clamping strap is thereby achieved in a simple manner such that the edge of the clamping strap facing the base body is deflected in the direction of the base body. This results in a reduction of the gap width of an intermediate space provided between the clamping strap and the base body and thus in the exertion of a clamping force onto an object arranged in this intermediate space.

In accordance with a further embodiment, each clamping strap is formed by a plurality of respectively planar strap sections which are oriented, at least in the clamping state of the clamping apparatus, substantially at right angles to a surface of the base body. The design of planar strap sections simplifies the manufacture of the clamping apparatus and simultaneously increases its stability. The substantially right-angled orientation of the strap sections to the surface of the base body simplifies the pressing-together and pulling apart of the clamping straps and the springing of the clamping straps from their convex position into their concave position or, vice versa, from their concave position into their convex position. It is generally also possible to make the clamping straps in a round arc shape.

Each end of the clamping straps is preferably fastened to a support post which is in particular respectively arranged in a corner region of the base body and preferably forms a guide for the object to be fastened to the clamping apparatus. The support posts can thus also satisfy a dual function, namely serving for the support of the clamping straps, on the one hand, and providing a correct alignment of the object to be clamped in the clamping apparatus, on the other hand.

Strap sections of the clamping straps adjacent to one another and/or the clamping straps and the support posts are advantageously connected to one another in the manner of a film hinge. A flexibility of the clamping straps is achieved in a simple manner by the film hinge-like connection of the individual strap sections to one another or of the clamping straps and the support posts which permits the pressing together of the clamping straps and the exertion of a clamping force onto an object arranged between the clamping straps and the base body. The respective film hinges are preferably formed by a tapering of the clamping strap material transversely to the longitudinal extent of the clamping straps. At the same time, the stability of the clamping apparatus can be increased by a correspondingly strengthened design of the strap sections and/or of the support posts.

In accordance with a further embodiment, fastening means, in particular clip/spring elements or latching lugs, are provided on the side of the base body remote from the clamping straps for the fastening of the clamping apparatus to a support. The object to be clamped, e.g. a flat conductor, can thereby be fastened in a simple manner, and in particular releasably, to a support or chassis with the aid of the clamping apparatus.

The base body can have at least one cut-out for an electronic component which is connected to an electrical lead to be fastened to the clamping apparatus. The clamping apparatus can thus form a protective housing for the electronic component which is simple to assemble.

The clamping straps are advantageously made in one piece with the base body. The clamping apparatus can thus not only be manufactured in a particularly favorable manner, e.g. as an injection molded plastic part, but is also particularly simple to handle.

BRIEF DESCRIPTION OF THE DRAWINGS

The present invention will be described in the following purely by way of example with reference to advantageous embodiments and to the enclosed drawings. There are shown:

FIGS. 3A-C are a sequence of assembly steps for the fastening of a flat conductor in the clamping apparatus of FIG. 1;

FIG. 4 is a rear side view of the clamping apparatus of FIG. 1; and

FIG. 5 is a perspective view of a further embodiment of the clamping apparatus in accordance with the invention.

DESCRIPTION OF THE PREFERRED EMBODIMENT

Figure 1:
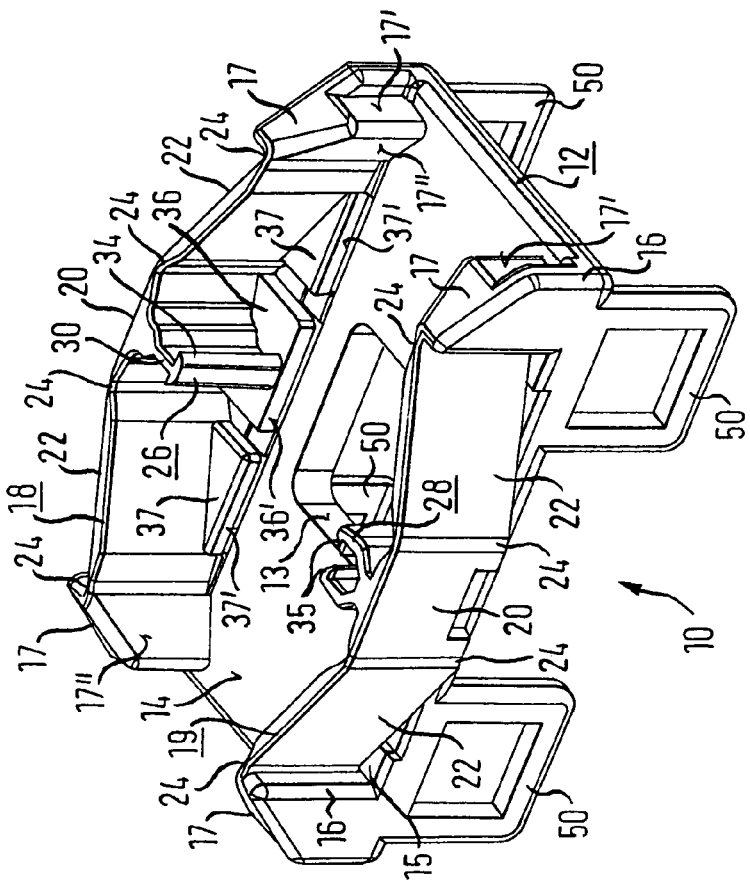
FIG. 1 is an embodiment of the clamping apparatus in accordance with the invention in the non-clamping state.

FIG. 1 shows a first embodiment of the clamping apparatus 10 in accordance with the invention which is made in one piece and has a plastic material. The clamping apparatus 10 can, for example, be an injection-molded part.

The clamping apparatus 10 includes a base body 12 which has the shape of a rectangular plate in the embodiment shown. Both sides of the plate are made substantially planar. In a central region of the plate, a substantially rectangular cut-out 13 of the base body 12 is provided whose purpose will be described in more detail in connection with FIG. 4.

On the one side of the base body 12, which will be called the front side 14 in the following, guide projections 15 are arranged along the longitudinal edges of the base body 12 whose purpose will be described in more detail in connection with FIG. 3A.

Furthermore, four support posts 16 are provided at the front side 14, with each support post 16 being arranged in a corner region of the base body 12 and being oriented substantially at right angles to the front side 14 of the base body 12.

Each support body 16 has a projection 17 which extends toward the longitudinal central plane of the base body 12 and which includes a first side 17', which is oriented at right angles to the longitudinal cross-sectional plane of the base body 12 and faces toward the edge of the base body 12, and a second side 17'' which is oriented obliquely to the first side 17' and faces toward the respective support post 16 lying diagonally opposite. The purpose of the projections 17 will be explained in connection with FIG. 3 A.

The support posts 16 serve for the support of two clamping straps 18, 19 which respectively extend between the corresponding support posts 16 arranged successively in the longitudinal direction at opposite longitudinal sides of the base body 12. The lower edges of the clamping straps 18, 19 have such a spacing to the front side 14 of the base body 12 that the clamping straps 18, 19—as will be explained in connection with FIG. 3—can move over an object, e.g. a flat conductor, to be fastened in the clamping apparatus 14.

Each clamping strap 18, 19 is formed by three strap sections, namely by a central section 20 and two end sections 22, which adjoin the center section 20 at opposite sides thereof. The end sections 22 are connected to the respective support posts 16 at their ends respectively facing away from the central section 20.

Both the central section 20 and the end sections 22 of the clamping straps 18, 19 have such a material thickness that they are substantially rigid. The clamping straps 18, 19 only have a comparatively low material thickness in the transition regions 24 between the end sections 22 and the central section 20 or the end sections 22 and the respective support posts 16 in order to give the clamping straps 18, 19 a certain flexibility. Each transition region 24 thus forms a film hinge.

The length of the clamping straps 18, 19 is larger than the spacing between the support posts 16 at which the clamping straps 18, 19 are respectively supported. The clamping straps 18, 19 therefore do not extend in a straight line between their respective support posts 16, but have a curved extent. The clamping straps 18, 19 of the embodiment shown in the plan view of the front side 14 do not describe an arc-shaped curvature, but a sequence of straight segments angled with respect to one another which are caused by a multiple angling of the clamping straps 18, 19 in the respective film hinge-like transition regions 24.

FIG. 1 shows the clamping apparatus in the non-clamping state, i.e. in an open state of the clamping apparatus 10. In this state, the clamping straps 18, 19 are curved convexly outwardly with respect to the center of the base body 12, i.e. the central sections 20 of the clamping straps 18, 19 have a larger spacing from one another than the ends of the clamping straps 18, 19 connected to the support posts 16.

Figure 2:
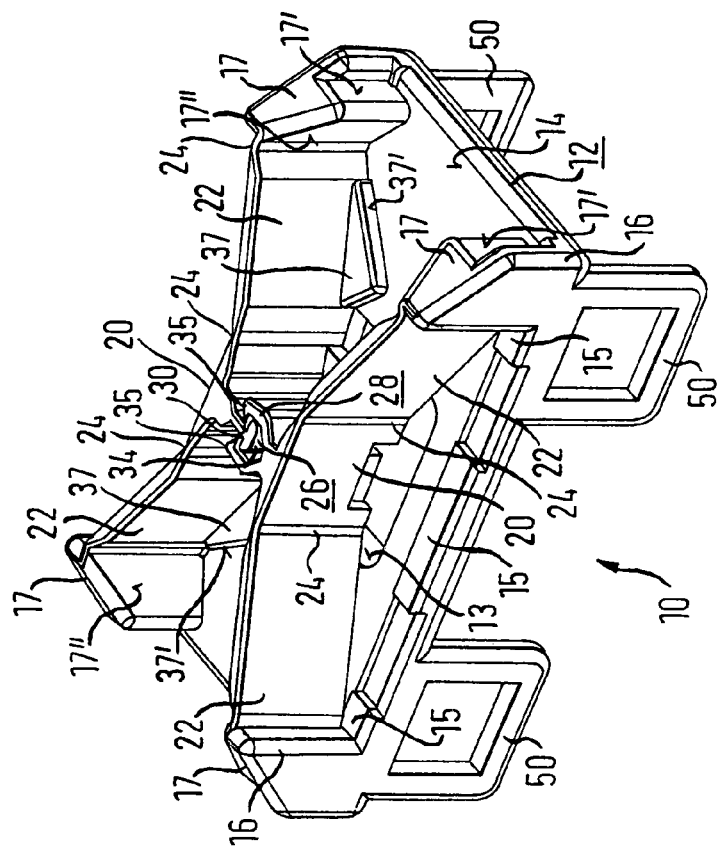
FIG. 2 is the clamping apparatus of FIG. 1 with pressed-together clamping straps.

By pressing the clamping straps 18, 19 together, they can be moved out of their convex position into a concave position, i.e. into a closed state of the clamping apparatus 19, in which the clamping straps 18, 19 have a smaller spacing in the region of their central sections 20 than in the region of their ends supported at the support posts 16, as is shown in FIG. 2.

To press the clamping straps 18, 19 together, it is not necessary to exert a force onto the clamping straps 18, 19 during the whole deformation of the clamping straps 18, 19. It is rather sufficient to overcome a specific pressure point which approximately marks the border between the convex curvature and the concave curvature of the clamping straps 18, 19. After this pressure point has been overcome, the clamping straps 18, 19 automatically spring to the other side of an imaginary plane which extends through the support posts 16 of the respective clamping strap 18, 19.

The clamping straps 18, 19 have closing means for the latching of the clamping straps 18, 19 in the pressed-together state for protection against an unintended springing back of a clamping strap or of both clamping straps 18, 19. These closing means are formed by latching means 26, 28 which are each provided in the region of the central sections 20 of the clamping straps 18, 19.

The latching means 26 of the first clamping strap 18 includes a web 30 which extends transversely to the longitudinal extent of the clamping strap 18 and substantially over the whole width of the clamping strap 18. The web 30 projects from the central section 20 of the clamping strap 18 and extends in the direction of the second clamping strap 19. At its end facing away from the central section 20, the web 30 is provided with a wider section 34 such that the latching means 26 of the first clamping section 18 has a mushroom-like or T shape in section, i.e. in the plan view of the front side 14 of the base body.

The latching means 28 of the first clamping strap 19 likewise extends transversely to the longitudinal extent of the clamping strap 19 and substantially over the whole width of the clamping strap 19. Starting from the central section 20 of the clamping strap 19, it furthermore extends in the direction of the first clamping strap 18. The latching means 28 has a cup-shaped or U-shaped section, with latch hooks 35 being provided at the free ends of the section which each face inwardly, i.e. toward one another.

As shown in FIG. 2, the latching means 26, 28 are made complementary to one another such that the latching means 26 of the first clamping strap 18 snaps into the latching means 28 of the second clamping strap 19 in the pressed-together state of the clamping straps 18, 19, such that the latch hooks 35 of the second latching means 28 engage behind the wider section 34 of the first latching means 26, whereby a latch connection is created between the latching means 26, 28 and thus between the clamping straps 18, 19.

In the lower edge region of the central section 20 of the first clamping strap 18, a rectangular clamping plate 36 is molded which is oriented at right angles to the central section 20. In the non-pressed-together state, i.e. in the convex position of the clamping straps 18, 19, the clamping plate 36 thus extends approximately parallel to the front side 14 of the base body 12. The extent of the clamping plate 36 along the clamping strap 18 approximately corresponds to the length of the central section 20, whereas its extent in the direction perpendicular to the clamping strap 18 approximately corresponds to the height of the latching means 26 with respect to the central section 20 at its end facing the base body 12.

Furthermore, a clamping lug 37 is provided at each end section 22 of the clamping straps 18, 19 and extends from a lower edge region of the end sections 22—starting at right angles from these—in the direction toward the respectively other clamping strap 18, 19. The clamping lugs 37 have a triangular shape such that one edge 37' each of the clamping lugs 37 extends parallel to the longitudinal central axis of the base body 12 in the concave position of the clamping straps 18, 19, i.e. in the non-pressed-together state of the clamping straps 18, 19, with the edges 37' of the end sections 22 of a respective clamping strap 18, 19 being aligned with one another. In addition, the edge 36' of the clamping plate 36 facing away from the first clamping strap 18 is also aligned with the edges 37' of the clamping lugs 37 of the first clamping strap.

In the open state of the clamping apparatus 10, the clamping plate 36 and the clamping lugs 37 thereby create space for the insertion of an object to be clamped into the clamping apparatus 10.

The assembly of the clamping apparatus 10 to a flat conductor 38 will now be explained with reference to FIG. 3.

As can be seen from FIG. 3A, the flat conductor 38 is initially provided with four lateral cut-outs 40. The positioning and contour of the cut-outs 40 are matched to the projections 17 of the support posts 16.

The flat conductor 38 is inserted into the clamping apparatus 10 between the clamping straps 18, 19 located in the convex position and is arranged on the front side 14 of the base body 12 such that the projections 17 of the support posts 16 engage into the cut-outs 40 of the flat conductor 38. The flat conductor 38 is secured against a movement in the longitudinal direction relative to the clamping apparatus 10 by the projections 17 engaging into the cut-outs 40. The flat conductor 38 is moreover guided laterally by the guide projections 15 arranged between the support posts 16 along the longitudinal sides of the base body 12. The guide projections 15 therefore ensure, together with the support posts 16, a precise alignment of the flat conductor 38 with respect to the clamping apparatus 10.

The clamping straps 18, 19 are pressed together (FIG. 3B) and fixed to one another by the latching means 26, 28 (FIG. 3C) for the clamping of the flat conductor 38 in the clamping apparatus 10.

As indicated by the arrows 44 in FIG. 3C, the latching of the clamping straps 18, 19 effects a rotation of the clamping straps 18, 19 such that they exert a clamping force onto the flat conductor 38 by which the flat conductor 38 is fixed by means of a clamping seat in the clamping apparatus 10. The rotation of the clamping straps 18, 19 is achieved by a special design of the latching means 26, 28.

As can be recognized in FIG. 3B, the latching means 26, 28 have a lower height with respect to the respective clamping strap 18, 19 in their region remote from the base body 12 than in their region facing the base body 12. This increasing height of the latching means 26, 28 in the direction of the base body 12 effects a tilting of the central sections 20 of the clamping straps 18, 19 on the latching of the latching means 26, 28 such that the edges of the central sections 20 facing away from the housing 12 are pulled together and the edges of the central sections 20 of the clamping straps 18, 19 facing the base body 12 are pressed apart.

This tilting of the central sections 20 has the result that the edges of the clamping straps 18, 19 facing the base body 12 are deflected in the direction of the base body 12. At the same time, the tilting of the central sections 20 effects a tilting of the clamping plate 36 provided at the central section 20 of the first clamping strap 18 and of the clamping lugs 37 provided at the end sections 22 of the clamping straps 18, 19.

The result is that the regions of the clamping plate 36 and the clamping lugs 37 facing away from their respective clamping straps 18, 19 are pressed onto the flat conductors 38 to be clamped by the tilting of the central sections 20 and the rotation caused by this of the clamping straps 18, 19 in the direction of the base body 12. The flat conductor 38 is thereby securely held in the clamping apparatus 10.

FIG. 4 shows the rear side 46 of the clamping apparatus 10 now fastened to the flat conductor 38. A light emitting diode 48 connected to the flat conductor 38 is arranged in the cut-out 13 of the base body 12. Four latching lugs 50 are furthermore provided on the rear side 46 of the base body 12, are arranged in the corner regions of the base body 12 and extend substantially at right angles to the rear side 46 of the base body 12. The latching lugs 50 serve for the fastening of a cover (not shown) to the base body 12 by which the light emitting diode 48 can be protected against external influences.

In FIG. 5, a further embodiment of the clamping apparatus 10 in accordance with the invention is shown which only differs from the first embodiments shown in FIGS. 1 to 4 in that the base body 12 does not have any cut-out 13 and in that, instead of latching lugs 50, a centrally arranged clip/spring element 52 and two additional support spring elements 54 are provided at the rear side 46 of the base body 12 through which the clamping apparatus 10 can be fastened to a correspondingly formed support or chassis. The clamping apparatus 10 shown in FIG. 5 thus permits a fast and simple assembly of a flat conductor to the support or chassis.

In both the first and second embodiments of the clamping apparatus 10, the fastening of the flat conductor 38 to the clamping apparatus 10 is easily releasable: the clamping straps 18, 19 only have to be pulled apart and the flat conductor 38 removed from the clamping apparatus 10.

The invention claimed is:

1. A clamping apparatus comprising a base body and two clamping straps, the clamping straps being arranged opposite one another on one side of the base body, the clamping straps being made flexible at least sectionally, the clamping straps extending convexly with respect to one another in a non-clamping state of the clamping apparatus, the clamping straps being formed by a plurality of respectively planar strap sections which are oriented, at least in the non-clamping state of the clamping apparatus, substantially at right angles to a surface of the base body, and the clamping straps capable of being brought into engagement to each other by being pressed together in order thereby to fasten an object located between the clamping straps and the base body to the clamping apparatus by means of a clamping fit and thereby to define a pressed-together state of the clamping straps.

2. A clamping apparatus in accordance with claim 1, wherein the clamping straps can be fixed to one another in the pressed-together state.

3. A clamping apparatus in accordance with claim 1, wherein the clamping straps have closing means for fixing the clamping straps in the pressed-together state.

4. A clamping apparatus in accordance with claim 3, wherein the closing means are made such that, in the pressed-together state of the clamping straps, the closing means effect a rotation of at least one clamping strap through which an intermediate, space between the clamping strap and the base body is reduced, and a clamping force is exerted in the direction of the base body.

5. A clamping apparatus in accordance with claim 3, wherein the closing means extend transversely to the longitudinal extent of the clamping straps and substantially over the total width of the clamping straps.

6. A clamping apparatus in accordance with claims 3, wherein the closing means of at least one clamping strap has a lower height with respect to the clamping strap in a region remote from the base body than in a region facing the base body.

7. A clamping apparatus in accordance with claim 3, wherein the closing means comprises latching means.

8. A clamping apparatus in accordance with claim 1, wherein each end of the clamping straps is fastened to a support post which is arranged in a corner region of the base body.

9. A clamping apparatus in accordance with claim 8, wherein the support post forms a guide for the object to be fastened to the clamping apparatus.

10. A clamping apparatus in accordance with claim 1 wherein strap sections of the clamping straps adjacent to one another and/or the clamping straps and the support posts are connected to one another in the manner of a film hinge.

11. A clamping apparatus in accordance with claims 1, wherein fastening means, are provided on a side of the base body remote from the clamping straps for fastening the clamping apparatus to a support.

12. A clamping apparatus in accordance with claim 11, wherein the fastening means comprises clip/spring elements.

13. A clamping apparatus in accordance with claim 11, wherein the fastening means comprises latching lugs.

14. A clamping apparatus in accordance with claim 1, wherein the base body has at least one cut-out for an electronic component which is connected to an electrical lead to be fastened to the clamping apparatus.

15. A clamping apparatus in accordance with claim 1, wherein the clamping straps are made in one piece with the base body.

* * * * *